(12) United States Patent
Yamaguchi

(10) Patent No.: US 12,259,424 B2
(45) Date of Patent: Mar. 25, 2025

(54) INFORMATION PROCESSING APPARATUS AND NON-TRANSITORY COMPUTER READABLE MEDIUM STORING PROGRAM

(71) Applicant: FUJIFILM Business Innovation Corp., Tokyo (JP)

(72) Inventor: Yuta Yamaguchi, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 512 days.

(21) Appl. No.: 17/306,975

(22) Filed: May 4, 2021

(65) Prior Publication Data

US 2022/0178986 A1   Jun. 9, 2022

(30) Foreign Application Priority Data

Dec. 7, 2020   (JP) .................................. 2020-202838

(51) Int. Cl.
*G01R 31/28* (2006.01)
*G06T 11/00* (2006.01)

(52) U.S. Cl.
CPC .......... *G01R 31/2806* (2013.01); *G06T 11/00* (2013.01)

(58) Field of Classification Search
CPC ............................ G01R 31/2806; G06T 11/00
See application file for complete search history.

(56) References Cited

U.S. PATENT DOCUMENTS

| 11,029,671 B1 * | 6/2021 | Guglielmo | H01R 43/26 |
| 11,449,654 B1 * | 9/2022 | Warren | G06V 20/20 |
| 11,763,050 B1 * | 9/2023 | Warren | G06V 30/422 |
| | | | 716/139 |
| 2016/0217674 A1 * | 7/2016 | Stewart | F24F 11/38 |
| 2016/0260261 A1 * | 9/2016 | Hsu | G02B 27/01 |
| 2016/0327293 A1 * | 11/2016 | Grabowski | F24F 11/30 |
| 2018/0109083 A1 | 4/2018 | Fenker | |
| 2018/0136255 A1 * | 5/2018 | Albert | G01R 31/2806 |
| 2020/0086489 A1 * | 3/2020 | Goto | G06F 3/14 |

FOREIGN PATENT DOCUMENTS

| JP | 2001155048 | 6/2001 |
| JP | 2005093462 | 4/2005 |
| JP | 2010177291 | 8/2010 |
| JP | 2010277447 | 12/2010 |

(Continued)

OTHER PUBLICATIONS

Press release Corelis Sep. 14, 2011—https://www.corelis.com/corelis-releases-new-cd-version-7-6-boundary-scan-tool-suite/ (Year: 2011).*

(Continued)

*Primary Examiner* — Raymond L Nimox
(74) *Attorney, Agent, or Firm* — JCIPRNET

(57) ABSTRACT

An information processing apparatus includes a processor configured to: obtain failure information to identify details of a failure which has occurred in a target device on which failure analysis is to be performed; and superimpose and display information related to a part or a wire on a captured image of a printed circuit board included in the target device, the part or the wire being a possible cause for the failure identified by the failure information from multiple parts and wires disposed on the printed circuit board.

20 Claims, 18 Drawing Sheets

(56) References Cited

FOREIGN PATENT DOCUMENTS

| JP | 2011138930 | | 7/2011 |
|---|---|---|---|
| JP | 2019-160171 | | 9/2019 |
| JP | 2019160171 A | * | 9/2019 |

OTHER PUBLICATIONS

Corelis Boundary—Scan Whitepaper Revision Apr. 5, 2022 (Year: 2022).*
ScanExpress Viewer™, Visual Fault Identification System, JTAG Boundary—Scan Software by Corelis (Captured images) Feb. 10, 2012—https://www.youtube.com/watch?v=6hXuyBjiy_A (Year: 2012).*
ScanExpress DFT™, Design for Testability Analysis Software (Captured images) Feb. 10, 2012—https://www.youtube.com/watch?v=Wxfk0pU3pJo (Year: 2012).*
ScanExpress Viewer: Visual Fault Diagnostics and Repair System, Corelis Apr. 27, 2019, https://www.advancetech.in/wp-content/uploads/2020/05/ScanExpress_Viewer.pdf (Year: 2019).*
"Office Action of Japan Counterpart Application", issued on Oct. 15, 2024, with English translation thereof, p. 1-p. 5.

* cited by examiner

FIG. 10

| FAIL CODE | FAILURE TYPE | FUNCTIONAL CLASSIFICATION |
|---|---|---|
| 123-456 | POWER SUPPLY ERROR | PWR |
| 111-222 | I/O COMMUNICATION ERROR | I/O |
| 555-444 | OTHERS | OTHERS |
| ..... | .... | ..... |

FIG. 11

| PART LIST | | | WIRE PATTERN LIST | |
|---|---|---|---|---|
| PART NAME | FUNCTIONAL CLASSIFICATION | PART NUMBER | CONNECTION POINT | FUNCTIONAL CLASSIFICATION |
| LOGIC IC | I/O | IC101 | TR123 | I/O |
| | PWR | | IC103 | PWR |
| | OTHERS | | IC104 | OTHERS |
| TRANSISTOR | I/O | TR123 | IC101 | I/O |
| | | | IC102 | I/O |
| COMMUNICATION IC | I/O | IC102 | TR123 | I/O |
| POWER SUPPLY IC | PWR | IC103 | IC101 | PWR |
| GENERAL-PURPOSE IC | OTHERS | IC104 | IC101 | OTHERS |
| ... | ... | ... | ... | ... |

FIG. 15

| PART LIST | | | | WIRE PATTERN LIST | | |
|---|---|---|---|---|---|---|
| PART NAME | FUNCTIONAL CLASSIFICATION | PART NUMBER | DISPLAY TARGET (Y/N) | CONNECTION POINT | FUNCTIONAL CLASSIFICATION | DISPLAY TARGET (Y/N) |
| LOGIC IC | I/O PWR OTHERS | IC101 | Y | TR123 | I/O | Y |
| | | | | IC103 | PWR | N |
| | | | | IC104 | OTHERS | N |
| TRANSISTOR | I/O | TR123 | Y | IC101 | I/O | Y |
| | | | | IC102 | I/O | Y |
| COMMUNICATION IC | I/O | IC102 | Y | TR123 | I/O | Y |
| POWER SUPPLY IC | PWR | IC103 | N | IC101 | PWR | N |
| GENERAL-PURPOSE IC | OTHERS | IC104 | N | IC101 | OTHERS | N |
| ... | ... | ... | ... | ... | ... | ... |

INFORMATION PROCESSING APPARATUS AND NON-TRANSITORY COMPUTER READABLE MEDIUM STORING PROGRAM

CROSS-REFERENCE TO RELATED APPLICATIONS

This application is based on and claims priority under 35 USC 119 from Japanese Patent Application No. 2020-202838 filed on Dec. 7, 2020.

BACKGROUND (i) Technical Field

The present disclosure relates to an information processing apparatus and a non-transitory computer readable medium storing a program.

(ii) Related Art

Japanese Unexamined Patent Application Publication No. 2019-160171 discloses a display apparatus that, when superimposing and displaying augmented reality information on an image, captured by an imaging unit, of a target device for maintenance, displays parts for maintenance and parts not for maintenance in different display modes.

SUMMARY

Aspects of non-limiting embodiments of the present disclosure relate to an information processing apparatus and a non-transitory computer readable medium storing a program that make it easier to identify the part or wire which causes a failure, as compared with when information related to all parts and wires included in a printed circuit board is superimposed and displayed on a captured image of the printed circuit board.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

[Information Processing Apparatus]

According to an aspect of the present disclosure, there is provided an information processing apparatus including a processor configured to: obtain failure information to identify details of a failure which has occurred in a target device on which failure analysis is to be performed; and superimpose and display information related to a part or a wire on a captured image of a printed circuit board included in the target device, the part or the wire being a possible cause for the failure identified by the failure information from a plurality of parts and wires disposed on the printed circuit board.

BRIEF DESCRIPTION OF THE DRAWINGS

Exemplary embodiments of the present disclosure will be described in detail based on the following figures, wherein:

FIG. 10 is a table illustrating an example of an error list stored in an information storage;

FIG. 11 is a table illustrating an example of a part and wire list stored in the information storage as the disposition information;

FIG. 15 is a table illustrating a specific example of the manner in which the parts and wire patterns to be displayed using AR are identified;

DETAILED DESCRIPTION

Next, an exemplary embodiment of the present disclosure will be described in detail with reference to the drawings.

Figure 1:
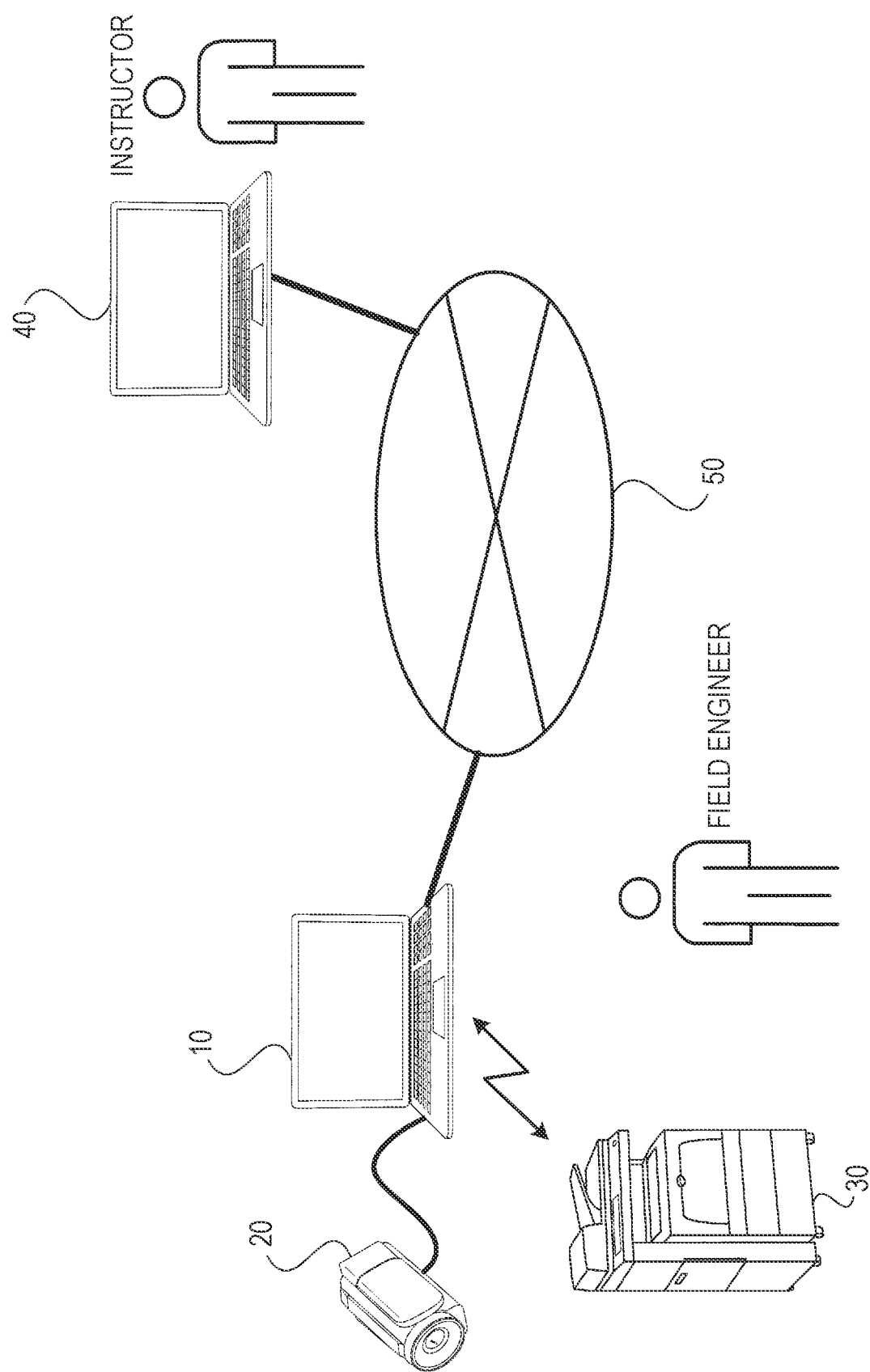
FIG. 1 is an illustration depicting the system configuration of an information processing system according to an exemplary embodiment of the present disclosure.

As illustrated in FIG. 1, an information processing system in the exemplary embodiment has a configuration in which a terminal apparatus 10 operated by a field engineer and a terminal apparatus 40 of an instructor are coupled via a network 50 such as the Internet, the field engineer who conducts an investigation to determine the cause of a failure which has occurred in a target device for which failure analysis is performed, the instructor who advises an analysis method to assist the field engineer in failure analysis.

In the exemplary embodiment, a description will be given using an image forming apparatus 30 as a target device for which failure analysis is performed. However, various electronic devices including a printed circuit board may serve as a target device for failure analysis. Note that the terminals 10, 40 are information processing apparatuses, such as personal computers.

In general, a failure analysis work in maintenance and inspection of an electronic device, such as an image forming apparatus, is performed by a field engineer who actually visits the customer installation site of the electronic device. In the failure analysis work, a printed circuit board is taken from an electronic device which is a failure analysis target, and the part which causes a failure is identified.

However, in recent years, the area of a printed circuit board built in an electronic device tends to be reduced, and the packaging density of parts has been increasing. Thus, although information on the part number of the parts to be mounted on a printed circuit board has been printed by silk printing or the like in the past, space for silk printing on a printed circuit board tends to be insufficient. In addition, for successful printing of information on part numbers, the information to be printed may have to be omitted or the character size may have to be reduced. Consequently, it has been difficult to directly obtain sufficient information from a printed circuit board.

Thus, in the information processing system in the exemplary embodiment, a camera 20 is connected to the terminal apparatus 10 to be operated by a field engineer, and the printed circuit board to be analyzed for failure is captured by the camera 20, and displayed on a display of the terminal apparatus 10. On the display of the terminal apparatus 10, information on specified ones of multiple parts and wire patterns mounted on a printed circuit board is superimposed and displayed using AR (an abbreviation for augmented reality) on a captured image of the printed circuit board. A field engineer gets the information on the parts and wire patterns on the printed circuit board by referring to such AR display.

Note that the terminal apparatus 10 in the exemplary embodiment and the image forming apparatus 30 serving as a failure analysis target are connected by a wireless link such as Bluetooth (registered trademark), Wi-Fi (registered trademark).

Figure 2:
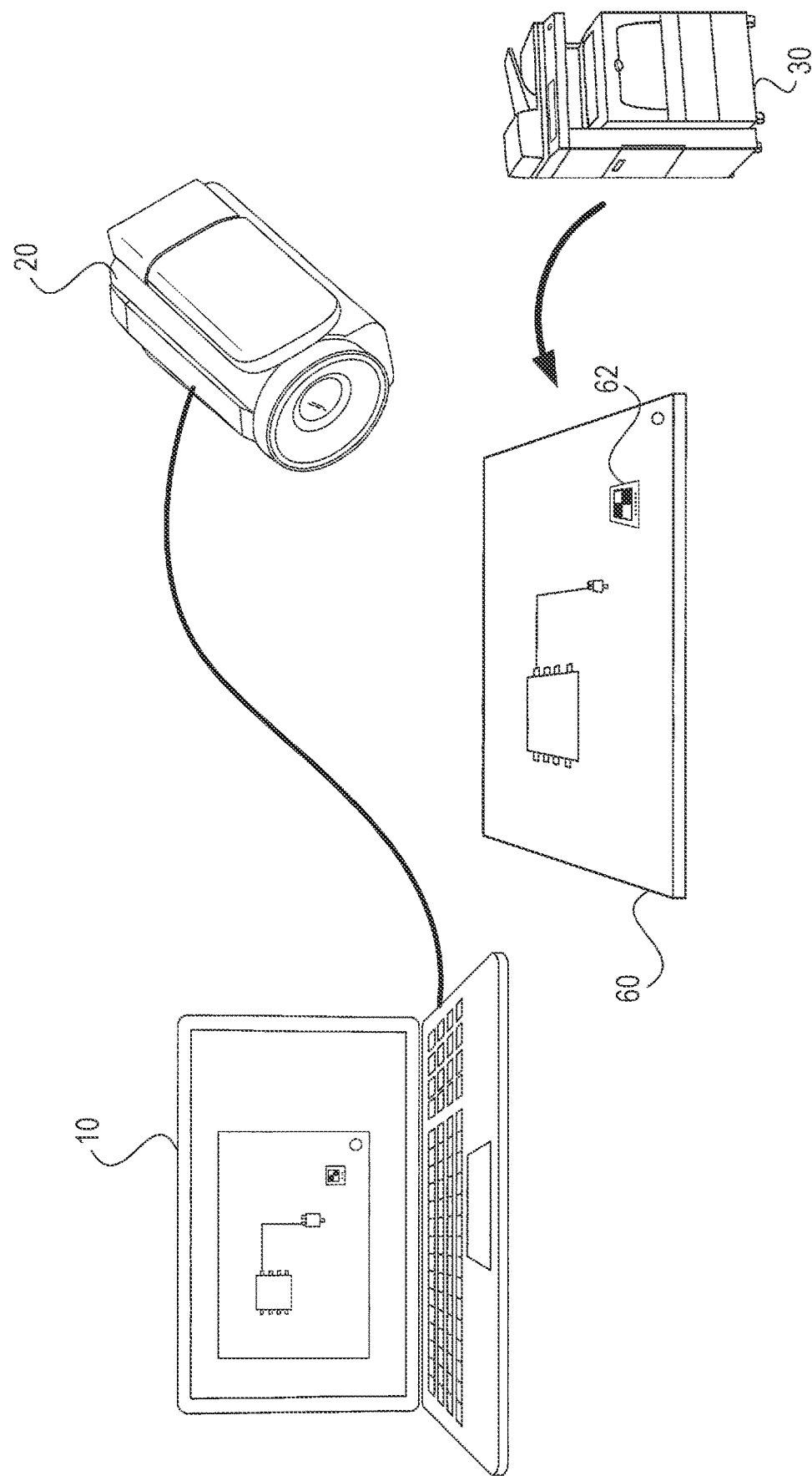
FIG. 2 is an illustration depicting the manner in which a printed circuit board, which is a failure analysis target, is taken out from an image forming apparatus and captured by a camera, and the captured image of the printed circuit board is displayed using AR.

FIG. 2 illustrates the manner in which the printed circuit board 60 taken from the image forming apparatus 30 serving as a failure analysis target is captured by the camera 20, and the captured image of the printed circuit board 60 is displayed using AR.

As illustrated in FIG. 2, a marker 62 to identify a reference position is provided on the printed circuit board 60, and detected in the terminal apparatus 10 from the image of the printed circuit board 60 captured by the camera 20, then an image of information on the parts and wire patterns is superimposed on the image of the printed circuit board 60 and displayed on the display based on the position of the detected marker 62.

The terminal apparatus 10 stores information on the distance between the reference position and each part or wire pattern mounted on the printed circuit board 60, and information on each part or wire pattern. The terminal apparatus 10 has a function of detecting the position of the marker 62 from the captured image of the printed circuit board 60, and a function of performing arithmetic processing for superimposing information on each part and wire pattern.

Figure 3:
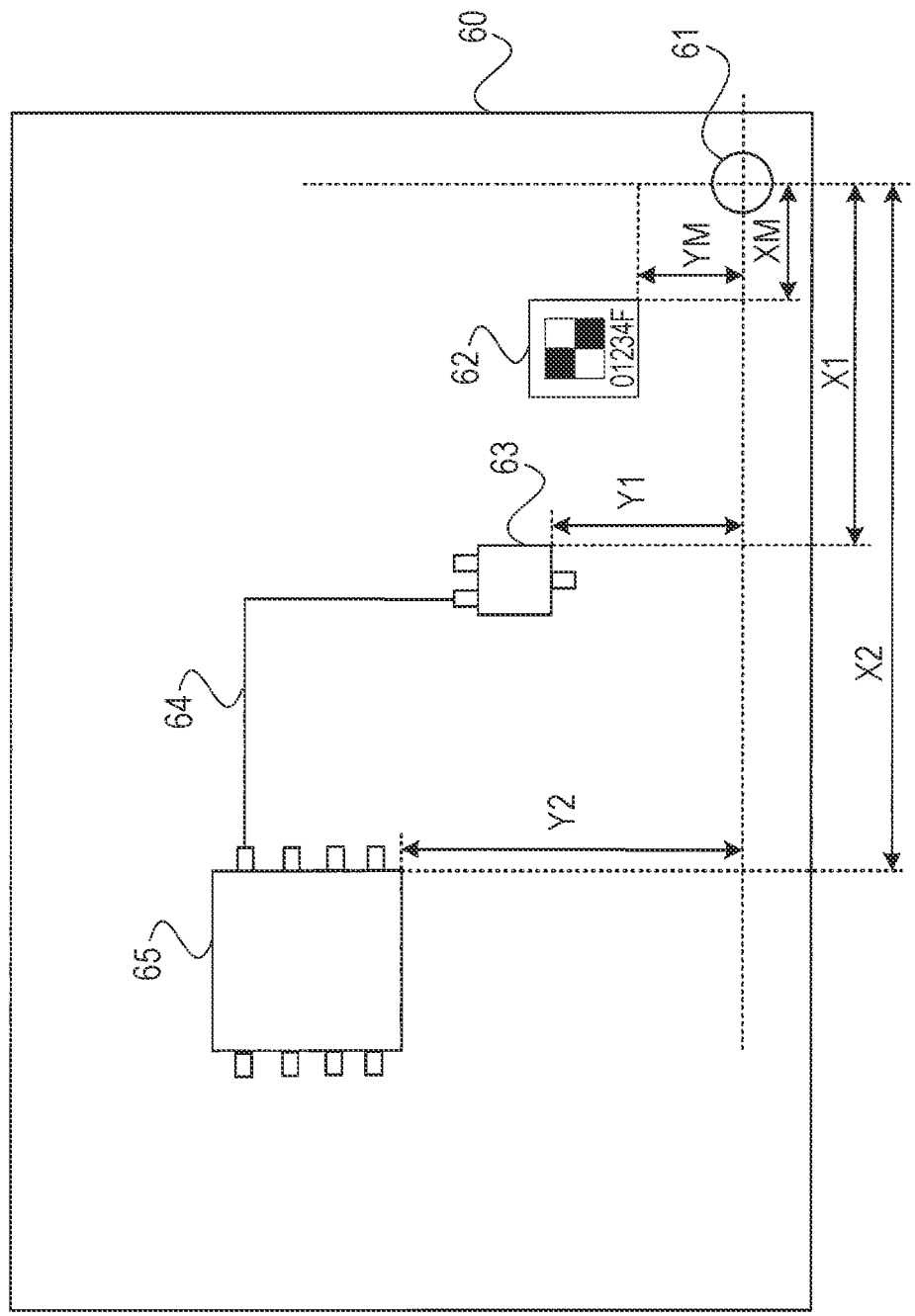
FIG. 3 is a view illustrating an example of the printed circuit board illustrated in FIG. 2.

FIG. 3 illustrates an example of the printed circuit board 60 illustrated in FIG. 2. Referring to FIG. 3, FIG. 3 illustrates the manner in which parts 63, 65 are mounted on the printed circuit board 60, and a wire pattern 64 connects a terminal of the part 63 and a terminal of the part 65. In FIG. 3, for the purpose of simplifying the description, a case will be described in which only two parts 63, 65 and one wire pattern are disposed on the printed circuit board 60. However, practically, a large number of parts and a large number of wire patterns to connect those parts are disposed on a printed circuit board.

Referring to FIG. 3, a reference point 61 as a design reference position is provided on the printed circuit board 60, which allows the positions of the parts 63, 65 and the marker 62 to be identified by the distance in X coordinate and the distance in Y coordinate from the reference point 61.

In addition, the marker 62 is provided with identification information to identify the type and the front or back side of the printed circuit board, and the marker 62 illustrated in FIG. 3 is provided with identification information labeled with "01234F". In the identification information, "01234" is information to identify the type of board, and "F" is the initial of Frontside. On the back side of the printed circuit board, identification information is provided, which is obtained by appending "B" as the initial of Backside to the information to identify the type of board. Specifically, a marker labeled with "01234B" is provided on the back side of the printed circuit board 60.

The terminal apparatus 10 in the exemplary embodiment has a function of, upon specification of a part or wire pattern on the printed circuit board 60 displayed on the display, displaying information on the specified part or wire pattern using AR. A specific example of display using AR on the terminal apparatus 10 in the exemplary embodiment is illustrated in FIG. 4, FIG. 5.

Figure 4:
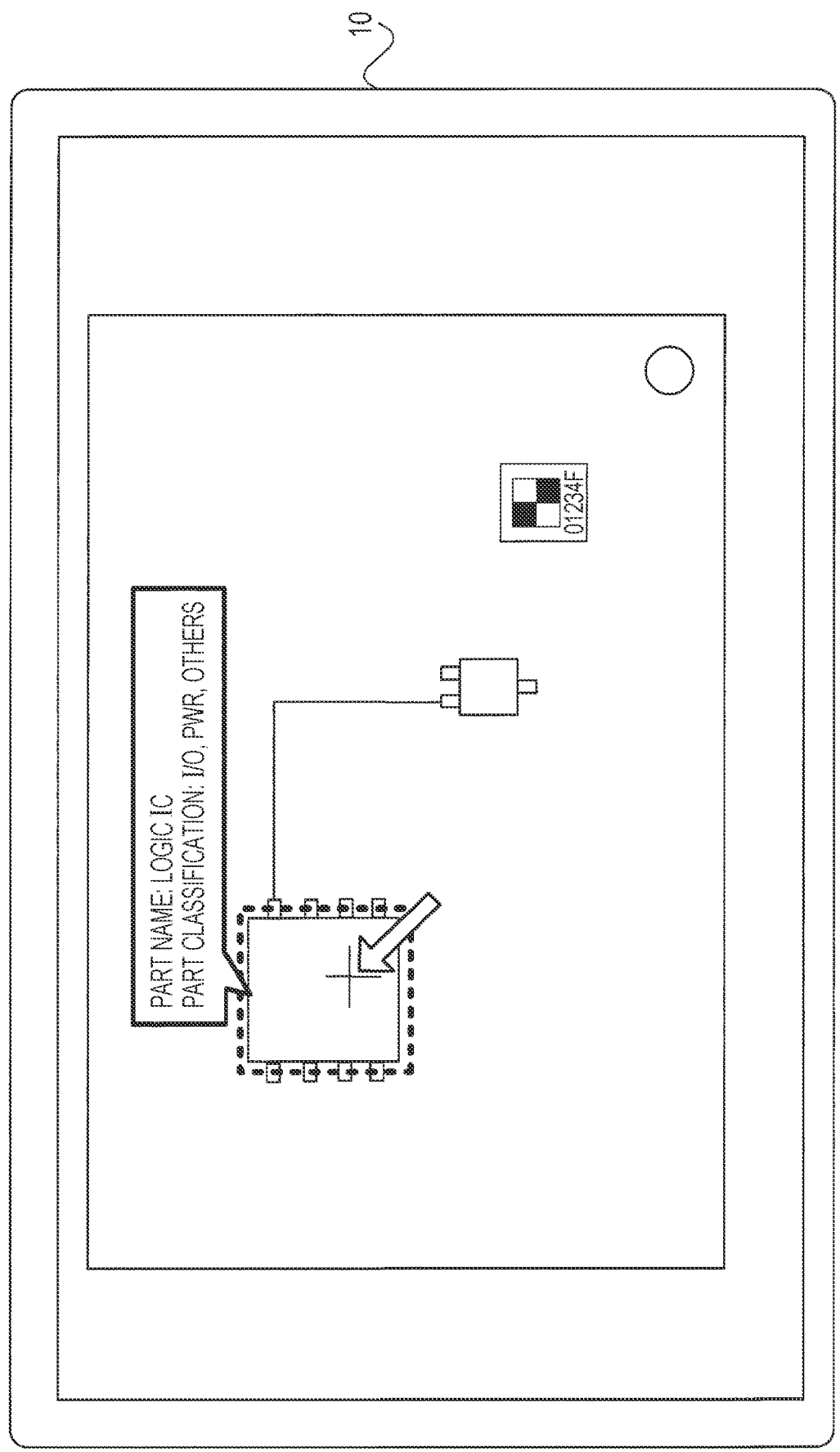
FIG. 4 is a view illustrating a specific example of display using AR on a terminal apparatus in the exemplary embodiment of the present disclosure.

FIG. 4 illustrates a case where the part 65 on the printed circuit board 60 are specified by a pointing device such as a mouse. The specified part is highlighted, for instance, with a red thick dotted line, and information on the part name "logic IC" and information on the part classification called "I/O, PWR, and others" are pop-up displayed.

Figure 5:
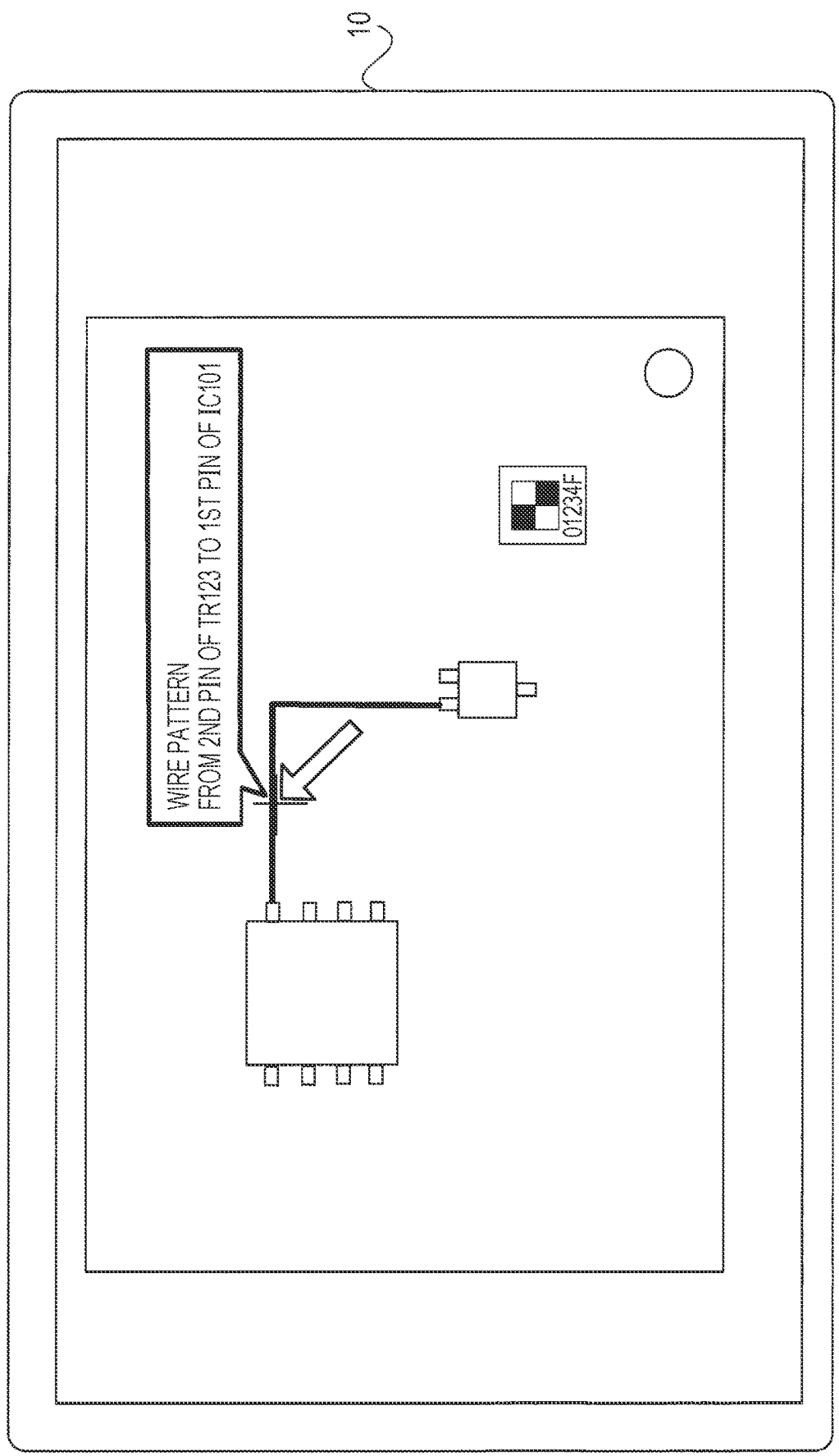
FIG. 5 is a view illustrating another specific example of display using AR on the terminal apparatus in the exemplary embodiment of the present disclosure.

In addition, FIG. 5 illustrates a case where the wire pattern 64 on the printed circuit board 60 is specified by a pointing device such as a mouse. The specified wire pattern is highlighted, for instance, with a red thick line, and connection information such as "from 2nd pin of TR123 to 1st pin of IC101" is pop-up displayed.

FIG. 4, FIG. 5 each illustrate a case where a particular part or wire pattern is specified by a pointing device such as a mouse on an image of the printed circuit board 60 displayed on the display of the terminal apparatus 10. However, a part or wire pattern pointed by a particular object, such as a finger of a user or a ball-point pen, on the printed circuit board 60 captured by the camera 20 may be identified by image processing, and the identified part or wire pattern may be assumed to be specified and displayed using AR.

When the part specified by a finger of a user is identified in this manner, the finger of a user is detected in the image captured by the camera 20 by performing image processing, and the part pointed by the detected finger is determined.

In the terminal apparatus 10 in the exemplary embodiment described above, when a field engineer specifies a part or wire pattern on the printed circuit board for failure analysis, information on the specified part or wire pattern can be displayed using AR and recognized.

However, the number of parts disposed on the printed circuit board tends to increase, and 4000 to 5000 parts may be disposed at most on one printed circuit board. Because a field engineer is not a circuit designer, when the field engineer has little experience of failure analysis, it is often the case that the field engineer cannot tell which part or wire pattern should be inspected. In such a case, the whole printed circuit board with the parts mounted has to be replaced.

Thus, in the information processing system in the exemplary embodiment, by using the configuration described below, as compared with the case where information related to all parts and wires included in the printed circuit board is superimposed and displayed on an image of the printed circuit board captured by the camera 20, the part or wire which causes a failure can be easily identified.

Figure 6:
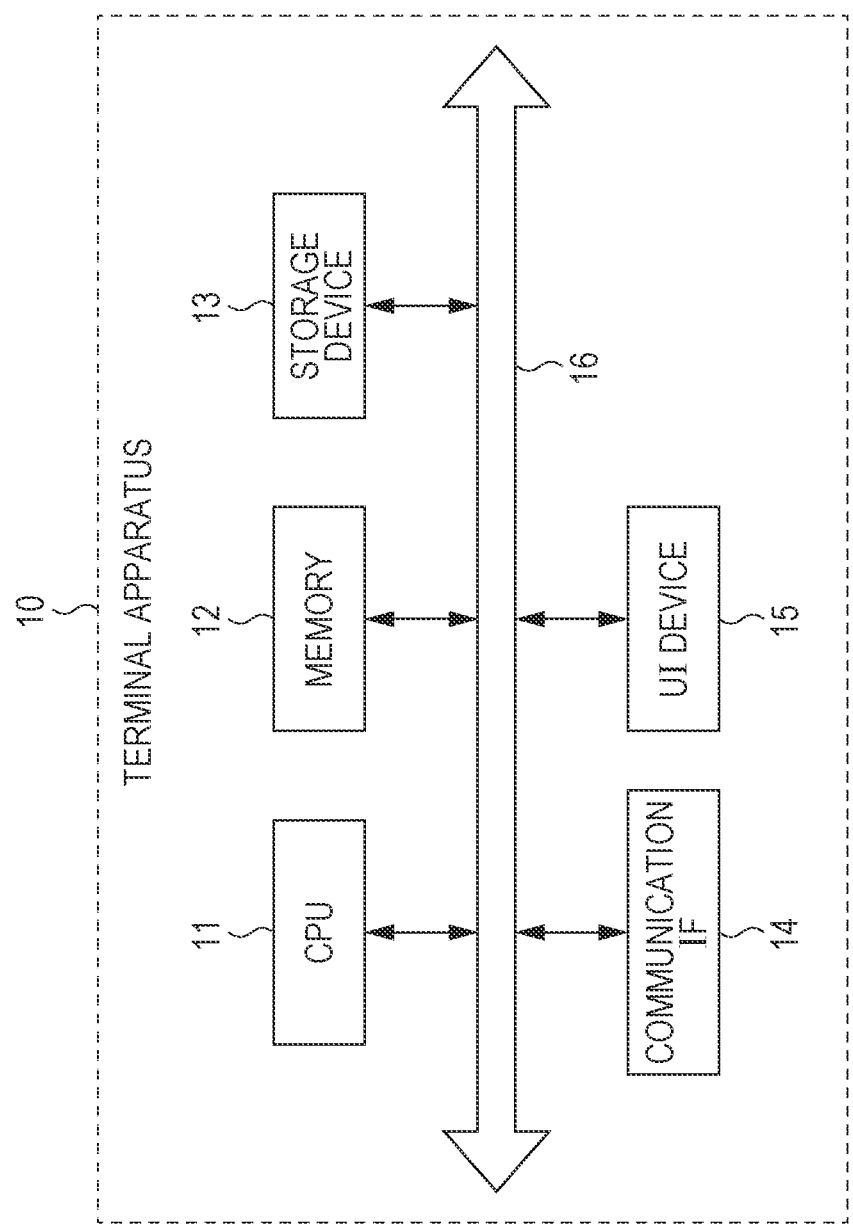
FIG. 6 is a block diagram illustrating the hardware configuration of the terminal apparatus in the exemplary embodiment of the present disclosure.

Next, the hardware configuration of the terminal apparatus 10 in the information processing system in the exemplary embodiment is illustrated in FIG. 6.

As illustrated in FIG. 6, the terminal apparatus 10 includes a CPU 11, a memory 12, a storage device 13 such as a hard disk drive, a communication interface (abbreviated as IF) 14 which transmits and receives data to and from an external device via a network 50, and a user interface (abbreviated as UI) device 15 including a touch panel or a liquid crystal display and a keyboard. These components are connected to each other via a control bus 16.

The CPU 11 is a processor that controls the operation of the terminal apparatus 10 by performing predetermined processing in accordance with a control program stored in the memory 12 or the storage device 13. Note that in the exemplary embodiment, a description is given assuming that the CPU 11 reads and executes the control program stored in the memory 12 or the storage device 13. However, it is also possible to store the program in a recording medium such as a CD-ROM and provide the program to the CPU 11.

Figure 7:
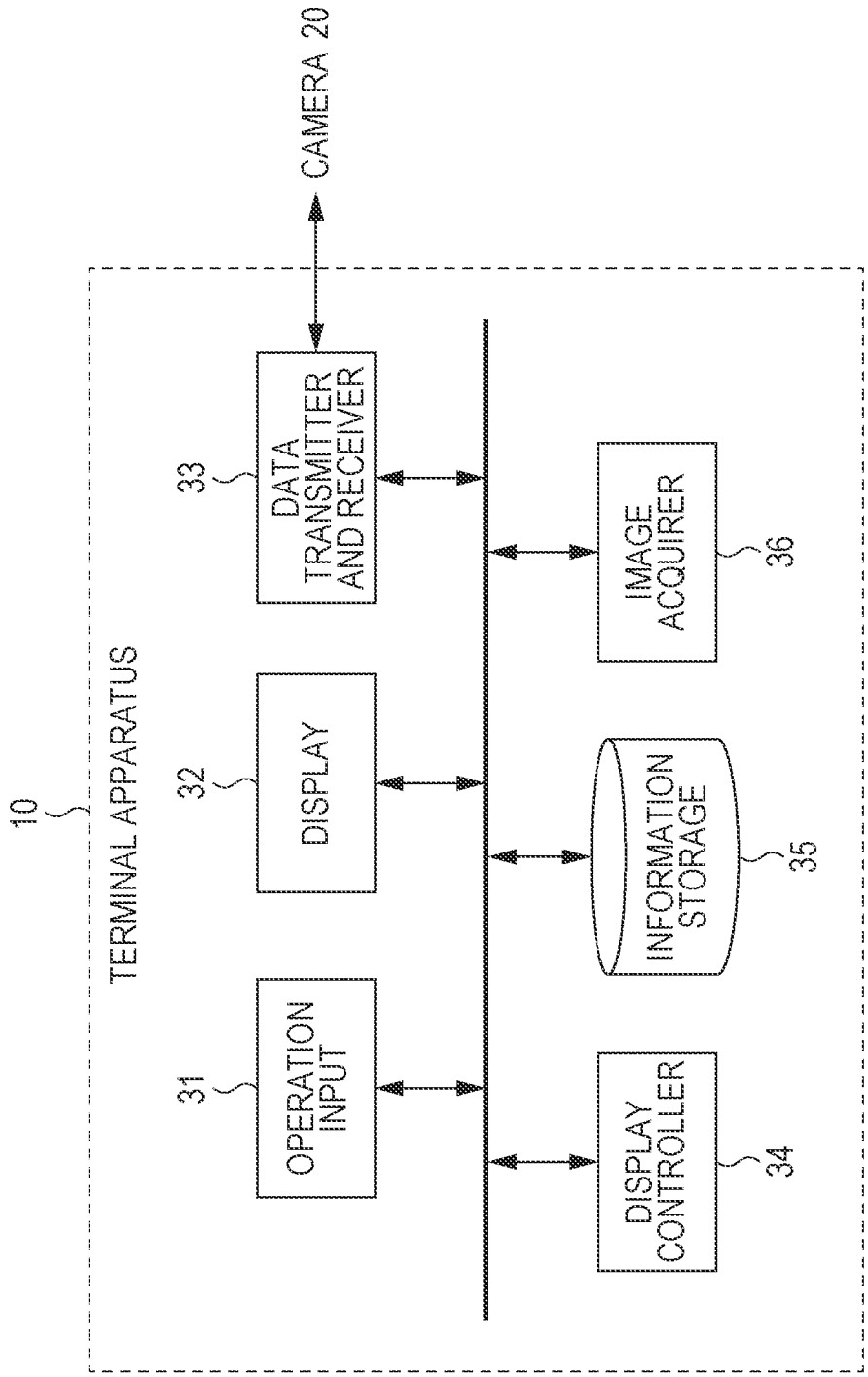
FIG. 7 is a block diagram illustrating the functional configuration of the terminal apparatus in the exemplary embodiment of the present disclosure.

FIG. 7 is a block diagram illustrating the functional configuration of the terminal apparatus 10, implemented by the control program being executed.

As illustrated in FIG. 7, the terminal apparatus 10 in the exemplary embodiment includes an operation input 31, a display 32, a data transmitter and receiver 33, a display controller 34, an information storage 35, and an image acquirer 36.

The operation input 31 receives an input of information on various operations performed by a user. The display 32 is controlled by the display controller 34, and displays various information for a user.

The data transmitter and receiver 33 transmits and receives data to and from an external device, such as the camera 20. The image acquirer 36 acquires an image of the printed circuit board via the data transmitter and receiver 33, the image being captured by the camera 20.

The information storage 35 stores disposition information on the disposition positions of the parts mounted on the printed circuit board and wire patterns connecting the terminals of parts. The disposition information is produced by retrieving only relevant information from a computer-aided design (CAD) design information file which is generated when the printed circuit board is designed. Alternatively, the CAD design information file itself may be stored in the information storage 35 as the disposition information.

When a field engineer is about to perform failure analysis of the image forming apparatus 30, the display controller 34 first obtains failure information to identify the details of a failure which has occurred in a target device for failure analysis. The failure information is, for instance, a fail code indicating a failure identified by self-diagnosis function in the image forming apparatus 30. The fail code is a failure code which consists of six digits, for instance, and identifies by the six digits the details of a failure which has occurred in the image forming apparatus 30.

When failure analysis is performed, the display controller 34 obtains a fail code from the image forming apparatus 30 via a wireless communication line. Alternatively, the display controller 34 may obtain a fail code based on an operation input by a user such as a field engineer.

The display controller 34 superimposes and displays information related to a part or wire pattern using AR on a captured image of the printed circuit board included in the image forming apparatus 30, the part or wire pattern being a possible cause for the failure identified by the fail code from multiple parts and wire patterns disposed on the printed circuit board.

For each fail code, the information storage 35 stores a function along with the above-mentioned disposition information, the function corresponding to the failure identified by the fail code. For each of the parts and wire patterns included in the printed circuit board, the information storage 35 stores the part or the wire pattern and the function implemented thereby in association with each other.

The display controller 34 then determines that a part or wire pattern implementing the function corresponding to the obtained fail code is a possible cause for the failure identified by the fail code.

Note that when an instructor advises a field engineer on failure analysis through the terminal apparatus 40, the data transmitter and receiver 33 of the terminal apparatus 10 receives from the terminal apparatus 40 as an external device via the network 50, information on the part or wire patterns to be inspected, and information on inspection items for which the part or wire patterns should be inspected.

The display controller 34 then performs AR display by superimposing the inspection item information received by the data transmitter and receiver 33 on the part or wire pattern to be inspected in the image of the printed circuit board.

In a further step of inspection work by a field engineer, when the information on inspection items displayed using AR on the display 32 of the terminal apparatus 10 is successively deleted by an instructor through the terminal apparatus 40, the display controller 34 deletes the information on inspection items based on instructions from the terminal apparatus 40, the inspection items being superimposed and displayed on the image of the printed circuit board.

Next, the operation of the terminal apparatus 10 in the exemplary embodiment will be described in detail with reference to the drawings.

Figure 8:
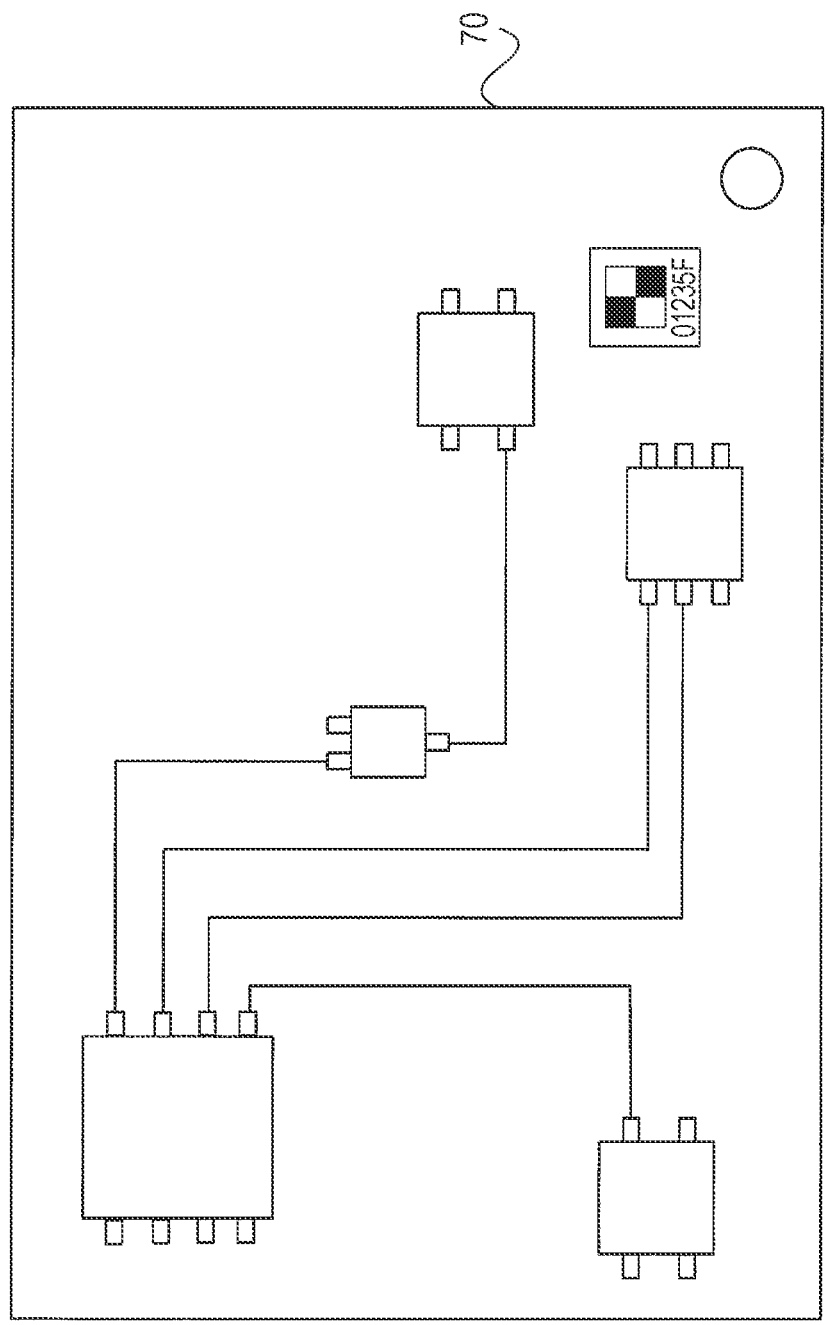
FIG. 8 is a view illustrating an appearance of a printed circuit board for AR display used when the operation of the terminal apparatus in the exemplary embodiment of the present disclosure is described.

First, FIG. 8 illustrates the appearance of a printed circuit board 70 for AR display, used when the operation of the terminal apparatus 10 in the exemplary embodiment is described. Referring to FIG. 8, it is seen that multiple parts are disposed on the printed circuit board 70, and those parts are connected by a wire pattern.

Next, the part name, part number, and functional classification of the printed circuit board 70 in FIG. 7 will be described with reference to FIG. 9.

Figure 9:
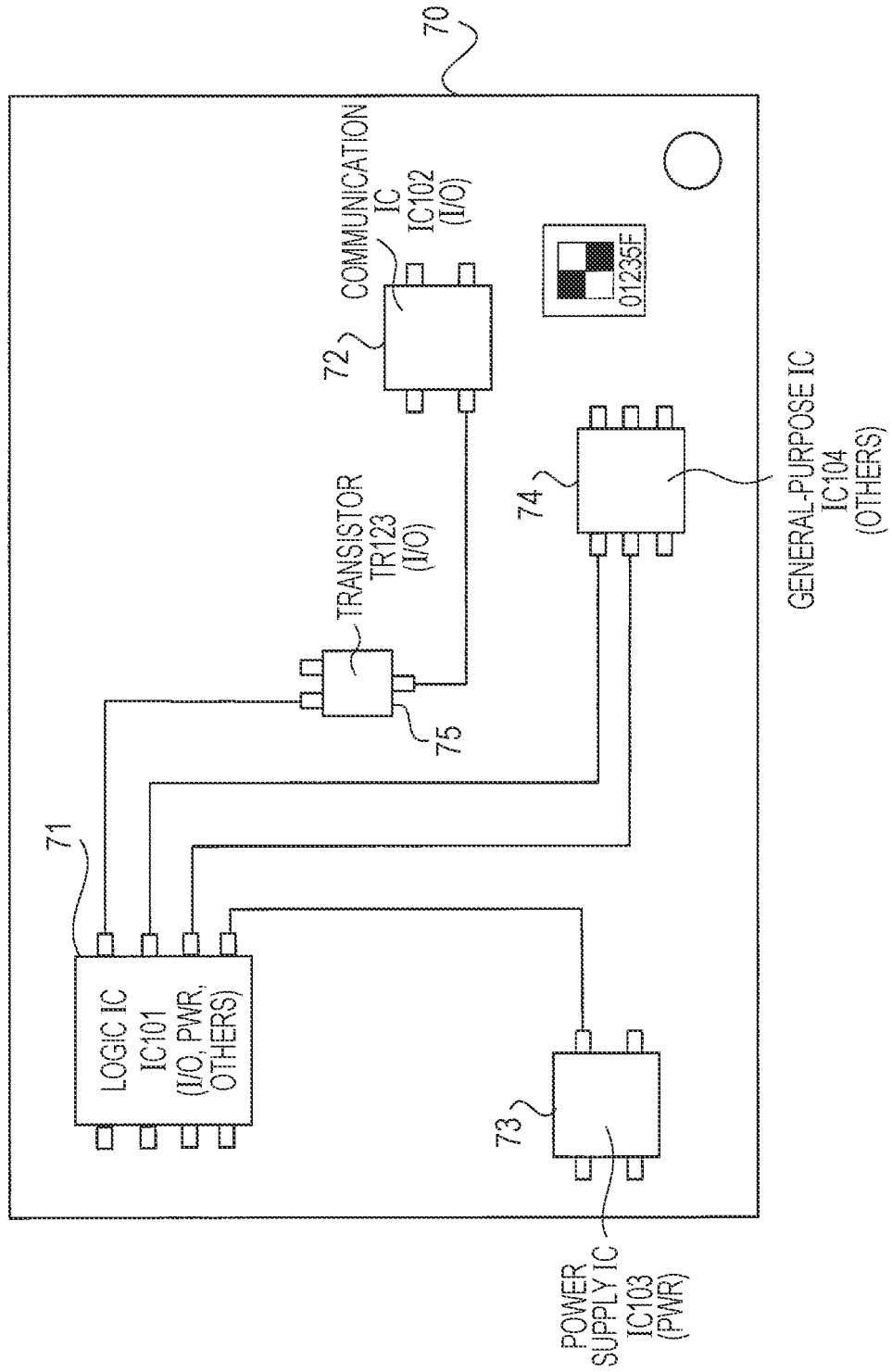
FIG. 9 is a view for explaining part names, part numbers, and functional classifications in the printed circuit board illustrated in FIG. 8.

Referring to FIG. 9, parts 71 to 75 disposed on the printed circuit board 70 are associated with part numbers IC101 to IC104, TR123, respectively. For the part 71, the part name is "logic IC", and the item called "I/O, PWR, others" is set as the functional classification. Note that the meaning content of the name of each functional classification will be described below.

In addition, for the part 72, the part name is "communication IC", and the item called "I/O" is set as the functional classification. Furthermore, for the part 73, the part name is "power supply IC", and the item called "PWR" is set as the functional classification. Furthermore, for the part 74, the part name is "general-purpose IC", and the item called "others" is set as the functional classification. Finally, for the part 75, the part name is "transistor", and the item called "I/O" is set as the functional classification.

Next, FIG. 10 illustrates an example of an error list stored in the information storage 35. Referring to FIG. 10, it is seen that, in the error list, fail code, failure type indicated by the fail code, and functional classification corresponding to the failure type are associated with each other. It is seen that failure information, fail code "123-456" corresponds to the failure type, "power supply error" for instance, and is associated with functional classification called "PWR". "PWR" means a power supply function, and "I/O" means a communication function.

In the exemplary embodiment, for the purpose of simplifying the description, only three specific error codes, and failure types and functional classifications corresponding to these error codes are used for the description. However, practically, much more fail codes are provided, and more detailed corresponding functional classifications are associated with the fail codes.

Next, FIG. 11 illustrates an example of a part and wire list stored in the information storage 35 as the disposition information. Referring to FIG. 11, for each part, a part name, a functional classification, and a part number are stored in association with each other. Also, it is seen that, for each wire pattern, a connection point and its functional classification are stored in association with each other, the connection point indicating which part is connected to which part.

Figure 12:
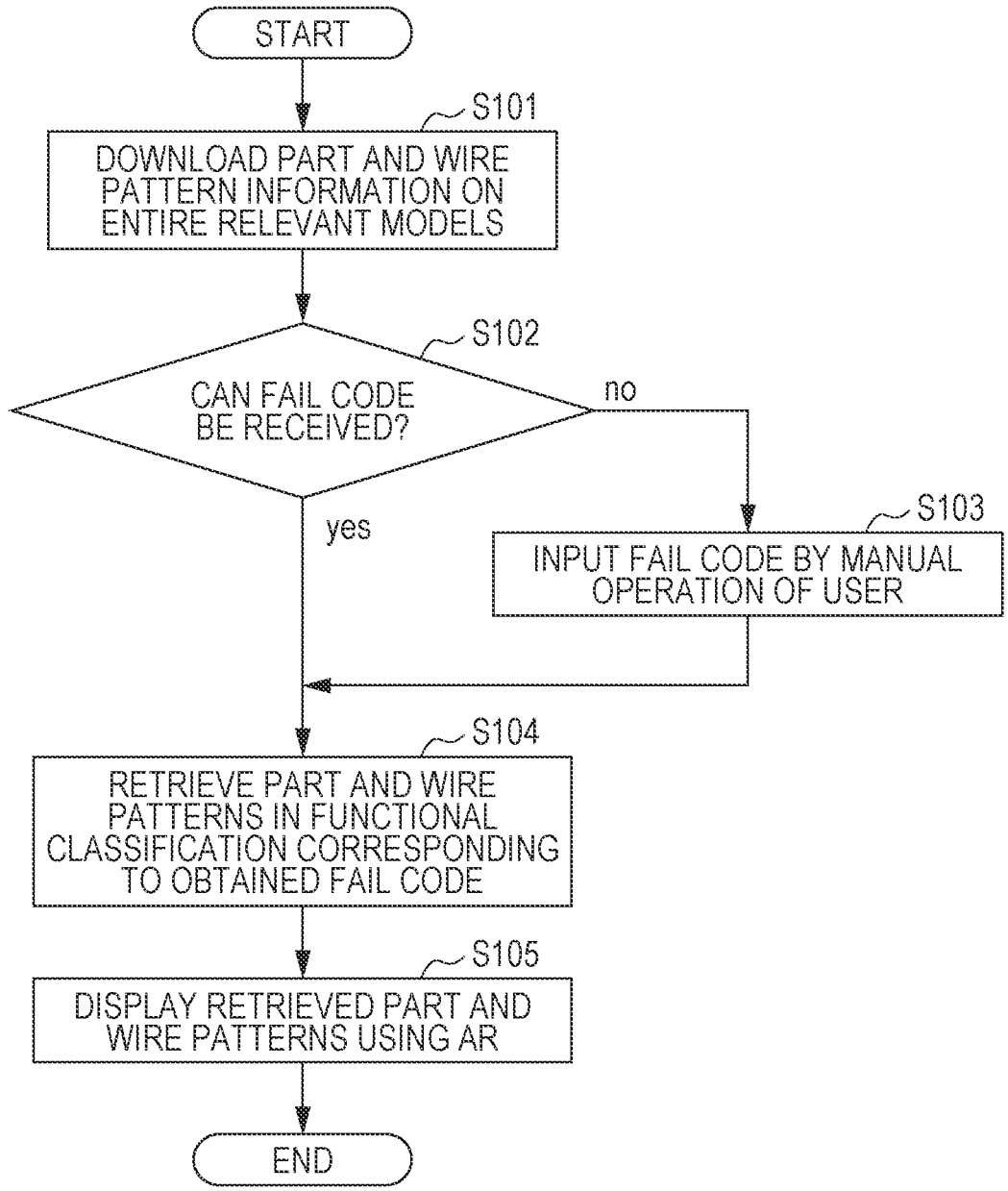
FIG. 12 is a flowchart for explaining the operation in the terminal apparatus when AR display is used for the printed circuit board captured by a camera of the terminal apparatus.

Next, the operation in the terminal apparatus 10 when an image of the printed circuit board 70 illustrated in FIG. 8 is displayed using AR will be described with reference to the flowchart of FIG. 12, the image being captured by the camera 20 of the terminal apparatus 10.

First, in the terminal apparatus 10, in step S101, upon input of model information on a model for which failure analysis is performed, information on the parts and wire patterns of a printed circuit board mounted on a model corresponding to the input model information is downloaded from a server apparatus which is not illustrated. Note that when a field engineer has obtained in advance the model information on the image forming apparatus 30 for which failure analysis is performed, the information on the parts and wire patterns of the printed circuit board mounted on the image forming apparatus 30 may be pre-stored in the terminal apparatus 10.

Figure 13:
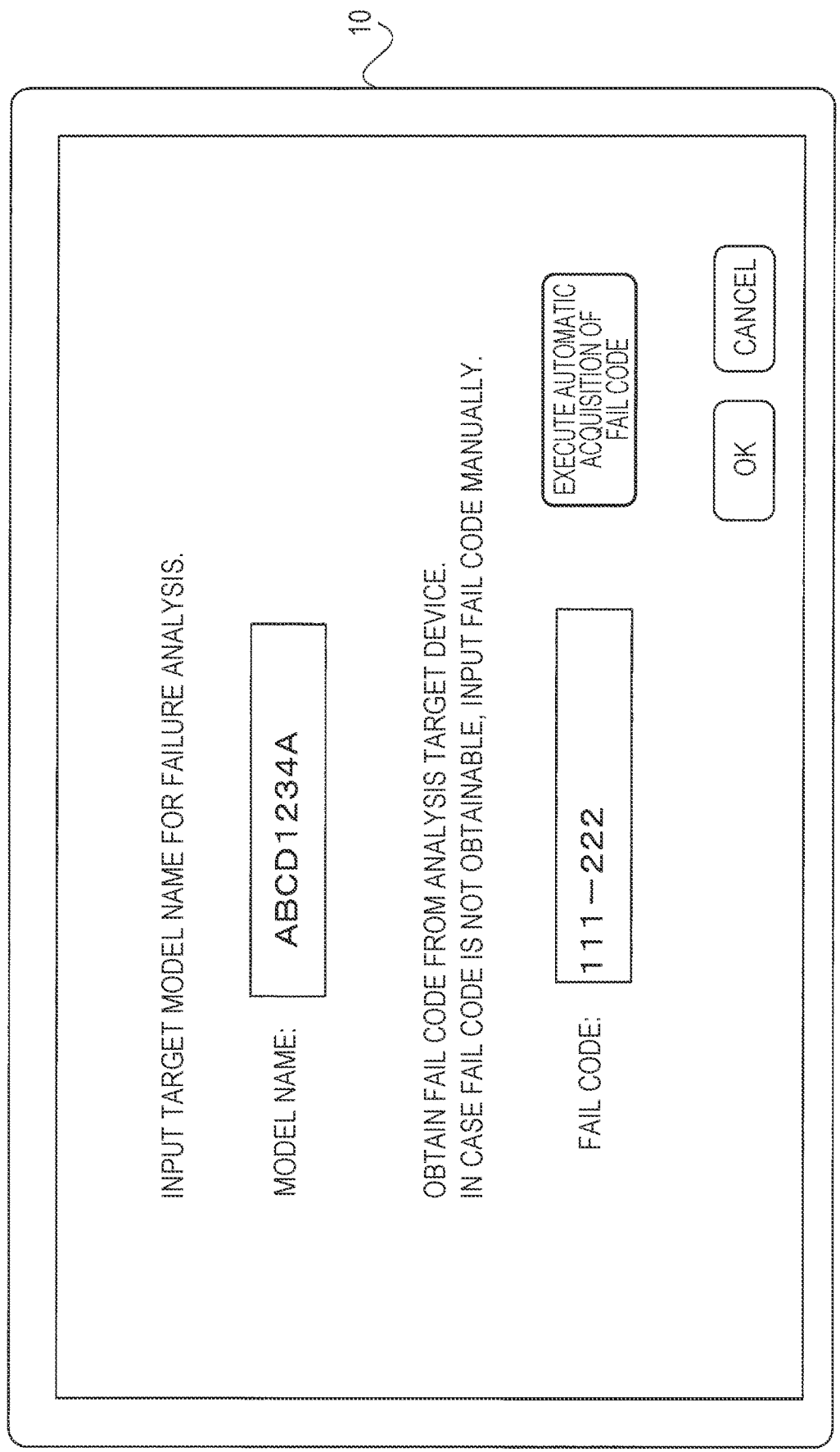
FIG. 13 is a screen view illustrating an operation screen example of the terminal apparatus when failure analysis is performed by a field engineer.

FIG. 13 illustrates an operation screen example of the terminal apparatus 10 when a field engineer is about to perform failure analysis. In the operation screen example illustrated in FIG. 13, it is seen that a field engineer is prompted to input a model name for which failure analysis is performed, and to acquire a fail code from an analysis target device.

Figure 14:
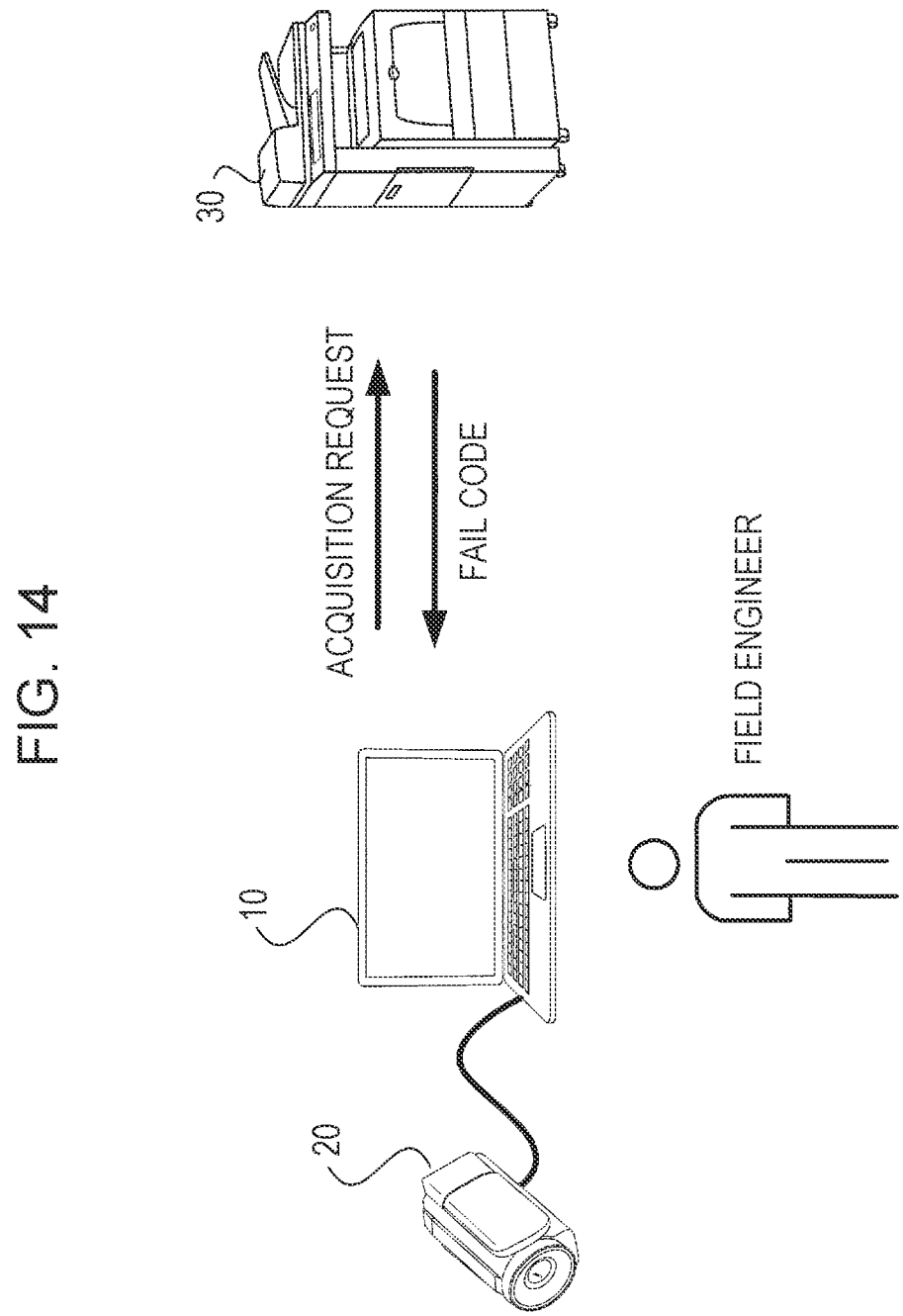
FIG. 14 is a screen view for explaining the manner in which a fail code is automatically acquired in the terminal apparatus from the image forming apparatus through a wireless link.

When a field engineer operates the button labeled with "automatic acquisition of fail code" on the operation screen illustrated in FIG. 13, as illustrated in FIG. 14, a fail code is automatically acquired from the image forming apparatus 30 via a wireless link. FIG. 14 illustrates the manner in which a request for acquisition of a fail code is made by the terminal apparatus 10 to the image forming apparatus 30, and in response to the request, the image forming apparatus 30 transmits a fail code acquired by self-diagnosis function or the like to the terminal apparatus 10.

In this manner, as stated in step S102, when the terminal apparatus 10 is able to automatically receive a fail code from the image forming apparatus 30, the terminal apparatus 10 acquires a fail code from the image forming apparatus 30 via a wireless link.

When the terminal apparatus 10 is not able to automatically receive a fail code from the image forming apparatus 30, the terminal apparatus 10 acquires a fail code by a manual operation of a user.

Then, in the terminal apparatus 10, in step S104, the parts and wire patterns in a functional classification corresponding to the acquired fail code are retrieved by the display controller 34.

In step S105, the display controller 34 uses AR display for the retrieved parts and wire patterns.

FIG. 15 illustrates a specific example of the manner in which the parts and wire patterns to be displayed using AR are identified by retrieving those parts and wire patterns in a functional classification corresponding to the fail code acquired by the display controller 34.

FIG. 15 illustrates the manner in which the display controller 34 has received a fail code "111-222" from the image forming apparatus 30.

Referring to the error list of FIG. 10, it is seen that the fail code "111-222" indicates that the failure type is "I/O communication error" and the functional classification is "I/O". Thus, from the part and wire list illustrated in FIG. 11, as the parts and wire patterns to be displayed using AR, the display controller 34 retrieves those parts and wire patterns, for which "I/O" is set as the functional classification.

As a consequence, as illustrated in FIG. 15, the display controller 34 identifies the three parts with the part numbers of 1C101, TR123, IC102, and two wire patterns connecting the three parts as the display target.

Figure 16:
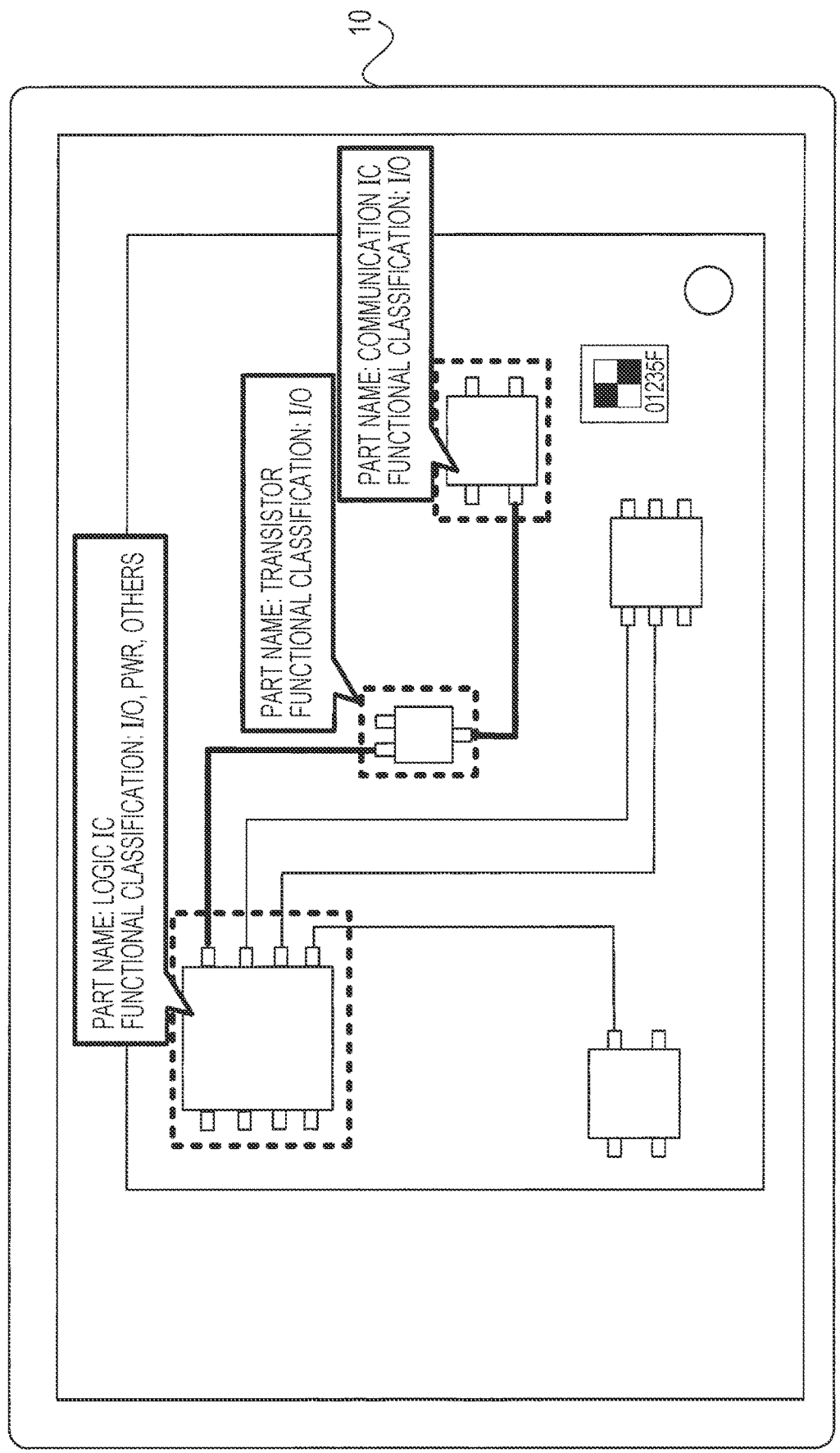
FIG. 16 is a screen view illustrating an AR display example when AR display is used for the parts and wire patterns identified as the display target based on the fail code.

FIG. 16 illustrates an AR display example when AR display is used for thus identified parts and wire patterns as the display target.

Referring to FIG. 16, it is seen that the identified parts and wire patterns as the display target are highlighted with a bold line, and information on the part names and part classifications of those parts is displayed using AR as character information. Note that it is also possible to display the part number of each part as well using AR.

Next, a case will be described in which an instructor assists a field engineer in failure analysis work through the terminal apparatus 40. In this case, all parts and wire patterns each identified by a fail code are not displayed using AR, but some parts and wire patterns selected by an instructor are displayed using AR.

Figure 17:
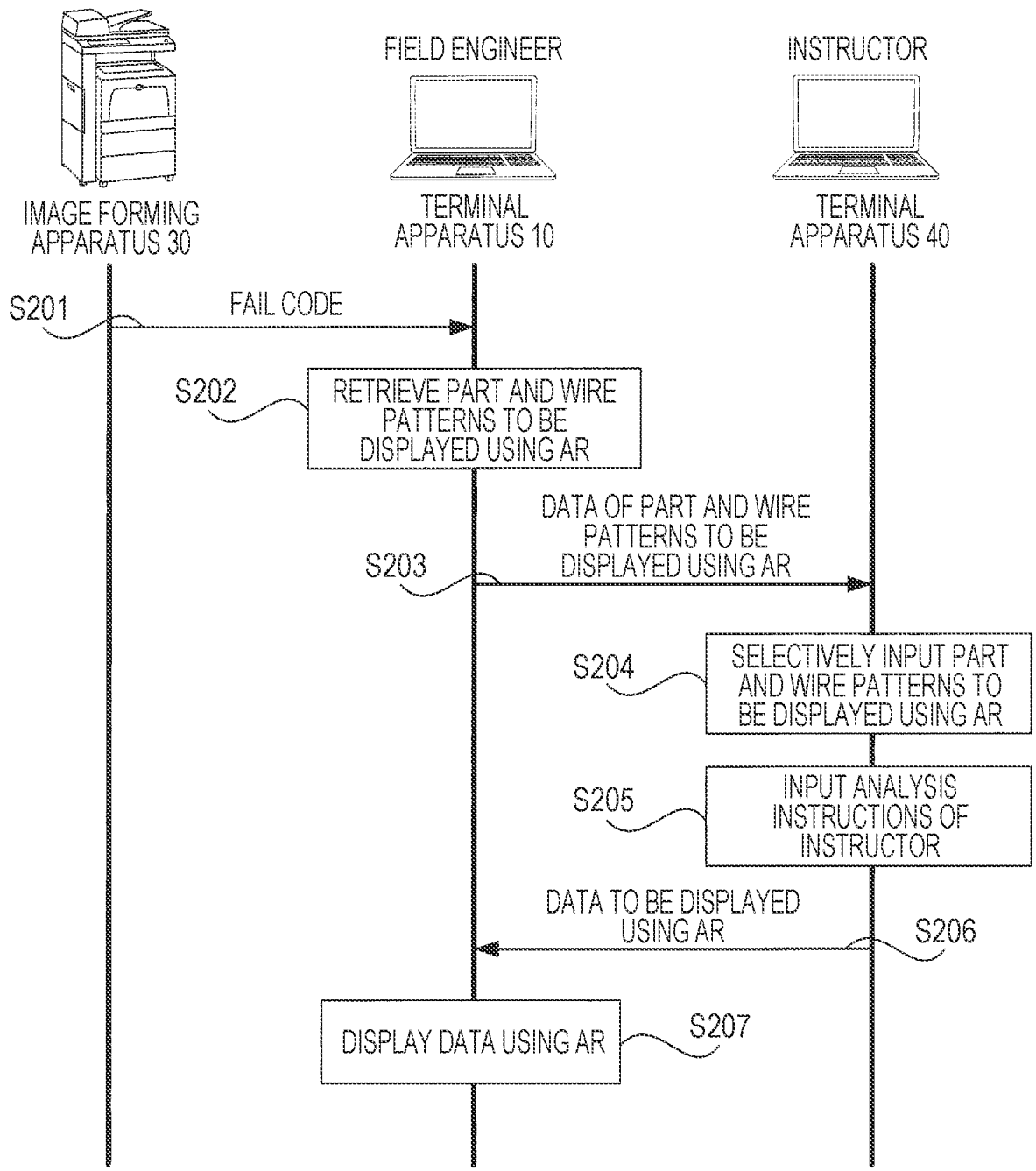
FIG. 17 is a sequence chart for explaining the operation when an instructor assists a field engineer in failure analysis work through a terminal apparatus.

The details of the operation to be performed between the image forming apparatus 30, and the terminals 10, 40 in such a case will be described with reference to the sequence chart of FIG. 17.

First, in step S201, a fail code of the image forming apparatus 30 is obtained by the terminal apparatus 10. In the terminal apparatus 10, in step S202, the parts and wire patterns for AR display are retrieved based on the obtained fail code.

In step S203, the data of the parts and wire patterns for AR display is transmitted from the terminal apparatus 10 to the terminal apparatus 40.

In the terminal apparatus 40, in step S204, the parts and wire patterns to be displayed using AR are selected by an operation of an instructor. Furthermore, in the terminal apparatus 40, in step S205, the instructor inputs instructions for an analysis procedure including an analysis order showing the order of analysis, and inspection items showing what kind of inspection is made.

In the terminal apparatus 40, in step S206, information on the parts and wire patterns to be displayed using AR, and information on the analysis procedure are transmitted to the terminal apparatus 10 as the data for AR display. In the terminal apparatus 10, in step S207, the information is displayed using AR based on the data transmitted from the terminal apparatus 40.

Figure 18:
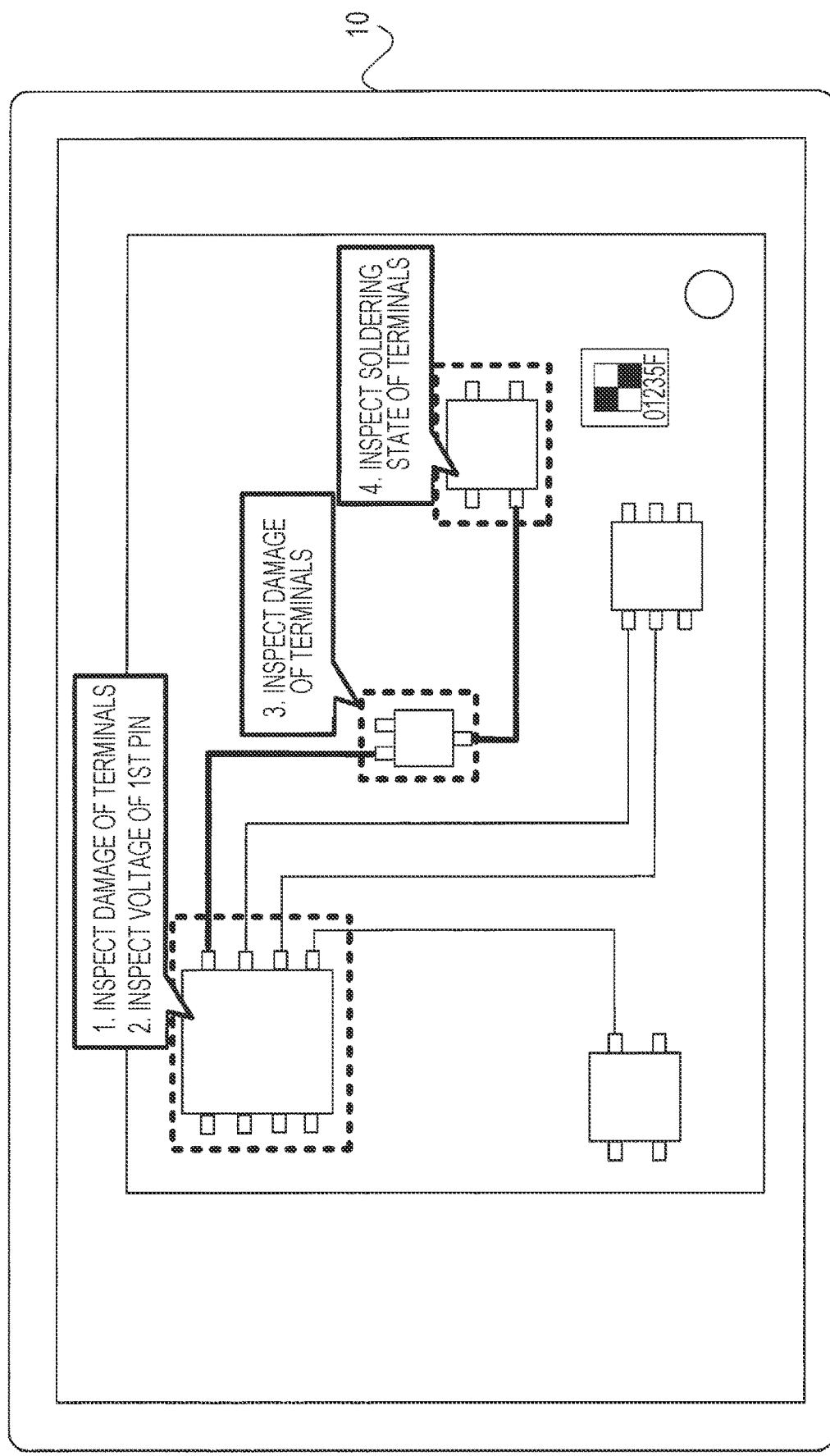
FIG. 18 is a screen view illustrating an AR display example when an instructor assists a field engineer in failure analysis work through a terminal apparatus.

FIG. 18 illustrates an example of such display using AR on the terminal apparatus 10. Referring to FIG. 18, it is seen that the parts and wire patterns to be analyzed are highlighted with a bold line, and AR display, such as "1. Check damage of the terminals", "2. Check the voltage of 1st pin", is provided to notify that what kind of points should be inspected for the parts in which order.

The field engineer successively performs inspection work in this manner based on the analysis procedure displayed using AR, thereby performing analysis work utilizing the advice of an instructor at a remote place.

In the embodiments above, the term "processor" refers to hardware in a broad sense. Examples of the processor include general processors (e.g., CPU: Central Processing Unit) and dedicated processors (e.g., GPU: Graphics Processing Unit, ASIC: Application Specific Integrated Circuit, FPGA: Field Programmable Gate Array, and programmable logic device).

In the embodiments above, the term "processor" is broad enough to encompass one processor or plural processors in collaboration which are located physically apart from each other but may work cooperatively. The order of operations of the processor is not limited to one described in the embodiments above, and may be changed.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. An information processing apparatus comprising:
a processor configured to:
obtain failure information comprising a functional classification to identify details of a failure which has occurred in a target device on which failure analysis is to be performed;
determine parts of the failure of the target device based on the functional classification;
determine connect points of the parts from a part list and a wire pattern list;
determine a wire of the failure of the target device based on the connection points;
superimpose and display information related to the parts and the wire on a captured image of a printed circuit board included in the target device on an augmented reality (AR) display, the parts and the wire being a possible cause for the failure identified by the failure information from a plurality of parts and wires disposed on the printed circuit board;
highlight, in the AR display, the parts being the possible cause for the failure by enclosing the parts with a frame and highlight, in the AR display, the wire being the possible cause of the failure with a bold line; and
display, in the AR display, on the parts and the wire being the possible cause of the failure, an instruction to inspect the parts and the wire.

2. The information processing apparatus according to claim 1,
wherein the failure information comprises a failure code of a plurality of failure codes, each indicating a failure identified by a self-diagnosis function of the target device, wherein each failure code is associated with a failure type and a functional classification.

3. The information processing apparatus according to claim 2,
wherein the processor is configured to obtain the failure code from the target device via a wireless communication line.

4. The information processing apparatus according to claim 2,
wherein the processor is configured to obtain the failure code based on an operation input by a user.

5. The information processing apparatus according to claim 2, further comprising:
a memory configured to:
store, for each failure code, a function corresponding to the failure identified by the corresponding failure code, and store, for each part or wire included in the printed circuit board, a function implemented by the part or the wire in association with the part or the wire,
wherein the processor is configured to determine that a part or a wire which implements the function corresponding to the failure code is a possible cause for the failure identified by the failure information.

6. The information processing apparatus according to claim 2, further comprising:
a memory configured to:
store, for the failure information, a function corresponding to the failure identified by the failure information, and store, for each part or wire included in the printed circuit board, a function implemented by the part or the wire in association with the part or the wire,
wherein the processor is configured to determine that a part or a wire which implements the function corresponding to the obtained failure information is a possible cause for the failure identified by the failure information.

7. The information processing apparatus according to claim 3, further comprising:
a memory configured to:
store, for the failure information, a function corresponding to the failure identified by the failure information; and
store, for each part or wire included in the printed circuit board, a function implemented by the part or the wire in association with the part or the wire,
wherein the processor is configured to determine that a part or a wire which implements the function corresponding to the obtained failure information is a possible cause for the failure identified by the failure information.

8. The information processing apparatus according to claim 4, further comprising:

a memory configured to:
  store, for the failure information, a function corresponding to the failure identified by the failure information; and
  store, for each part or wire included in the printed circuit board, a function implemented by the part or the wire in association with the part or the wire,
wherein the processor is configured to determine that a part or a wire which implements the function corresponding to the obtained failure information is a possible cause for the failure identified by the failure information.

9. The information processing apparatus according to claim 1,
wherein the processor is configured to:
  receive from an external device through a network, information on the parts and the wire to be inspected and information on inspection items for which the parts and the wire is to be inspected; and
  superimpose and display the received information on inspection items on the parts and the wire to be inspected in an image of the printed circuit board.

10. The information processing apparatus according to claim 2,
wherein the processor is configured to:
  receive from an external device through a network, information on the parts and wire to be inspected and information on inspection items for which the parts and the wire is to be inspected; and
  superimpose and display the received information on inspection items on the parts and the wire to be inspected in an image of the printed circuit board.

11. The information processing apparatus according to claim 3,
wherein the processor is configured to:
  receive from an external device through a network, information on the parts and the wire to be inspected and information on inspection items for which the parts and the wire is to be inspected; and
  superimpose and display the received information on inspection items on the parts and the wire to be inspected in an image of the printed circuit board.

12. The information processing apparatus according to claim 4,
wherein the processor is configured to:
  receive from an external device through a network, information on the parts and the wire to be inspected and information on inspection items for which the parts and the wire is to be inspected; and
  superimpose and display the received information on inspection items on the parts and the wire to be inspected in an image of the printed circuit board.

13. The information processing apparatus according to claim 5,
wherein the processor is configured to:
  receive from an external device through a network, information on the parts and the wire to be inspected and information on inspection items for which the parts and the wire is to be inspected; and
  superimpose and display the received information on inspection items on the parts and the wire to be inspected in an image of the printed circuit board.

14. The information processing apparatus according to claim 6,
wherein the processor is configured to:
  receive from an external device through a network, information on the parts and the wire to be inspected and information on inspection items for which the parts and the wire is to be inspected; and
  superimpose and display the received information on inspection items on the parts and the wire to be inspected in an image of the printed circuit board.

15. The information processing apparatus according to claim 7,
wherein the processor is configured to:
  receive from an external device through a network, information on the parts and the wire to be inspected and information on inspection items for which the parts and the wire is to be inspected; and
  superimpose and display the received information on inspection items on the parts and the wire to be inspected in an image of the printed circuit board.

16. The information processing apparatus according to claim 8,
wherein the processor is configured to:
  receive from an external device through a network, information on the parts and the wire to be inspected and information on inspection items for which the parts and the wire is to be inspected; and
  superimpose and display the received information on inspection items on the parts and the wire to be inspected in an image of the printed circuit board.

17. The information processing apparatus according to claim 9,
wherein the processor is configured to delete the information superimposed and displayed on the image of the printed circuit board based on instructions from the external device.

18. The information processing apparatus according to claim 10,
wherein the processor is configured to delete the information superimposed and displayed on the image of the printed circuit board based on instructions from the external device.

19. The information processing apparatus according to claim 11,
wherein the processor is configured to delete the information superimposed and displayed on the image of the printed circuit board based on instructions from the external device.

20. A non-transitory computer readable medium storing a program causing a computer to execute a process comprising:
  obtaining failure information comprising a functional classification to identify details of a failure which has occurred in a target device on which failure analysis is to be performed;
  determining parts of the failure of the target device based on the functional classification;
  determining connect points of the parts from a part list and a wire pattern list;
  determining a wire of the failure of the target device based on the connection points;
  superimposing and displaying information related to the parts and the wire on a captured image of a printed circuit board included in the target device on an augmented reality (AR) display, the parts and the wire being a possible cause for the failure identified by the failure information from a plurality of parts and wires disposed on the printed circuit board;
  highlighting, in the AR display, the part being the possible cause for the failure by enclosing the part with a frame and highlight, in the AR display, the wire being the possible cause of the failure with a bold line; and displaying, in the AR display, on the parts and the wire being the possible cause of the failure, an instruction to inspect the parts and the wire.

\* \* \* \* \*